United States Patent [19]

Solyst

[11] 4,157,935
[45] Jun. 12, 1979

[54] METHOD FOR PRODUCING NOZZLE ARRAYS FOR INK JET PRINTERS

[75] Inventor: Erik R. Solyst, San Jose, Calif.

[73] Assignee: International Business Machines Corporation, Armonk, N.Y.

[21] Appl. No.: 863,827

[22] Filed: Dec. 23, 1977

[51] Int. Cl.² .......................................... H01L 21/308
[52] U.S. Cl. ....................................... 156/644; 96/36;
    156/647; 156/654; 156/659; 156/662
[58] Field of Search .............. 156/628, 644, 647, 654,
    156/659, 662; 96/27 E, 36.1, 36.2, 36

[56] References Cited

U.S. PATENT DOCUMENTS

| 2,014,513 | 9/1935 | Zimmerman | 355/133 |
|---|---|---|---|
| 2,463,093 | 3/1949 | Felder | 355/133 |
| 3,373,437 | 3/1969 | Sweet et al. | 346/75 |
| 3,632,398 | 1/1972 | Konig | 427/43 |
| 3,856,525 | 12/1974 | Inoue | 96/27 E |
| 3,914,050 | 10/1975 | Dost et al. | 355/133 |
| 4,007,464 | 2/1977 | Bassous et al. | 346/75 |
| 4,066,491 | 1/1978 | Ruh et al. | 156/659 |

OTHER PUBLICATIONS

Bassous, "Fabrication . . . Dimensions," *IBM Technical Disclosure Bull.*, vol. 20, No. 6, (Nov. 1977), pp. 2474-2479.
Bassous et al., "Fabrication . . . Nozzles," *IBM Technical Disclosure Bull.*, vol. 17, No. 11, (Apr. 1975), pp. 3450-3452.

*Primary Examiner*—Jerome W. Massie
*Attorney, Agent, or Firm*—Otto Schmid, Jr.

[57] ABSTRACT

Nozzle arrays for ink jet recording are produced by preferred chemical etching of a substrate material which frequently has a non-uniform thickness. The preferred substrate is a monocrystalline silicon wafer and the 100 plane surface of the wafer is coated with etchant masking material and the resist coated wafer is held in close physical contact with a base member. A suitable mask member which defines a nozzle array pattern is spaced a predetermined distance from the base member and is positioned parallel to the base member. The wafer is then exposed through the mask by a suitable light source arranged at a suitable angle while the wafer is simultaneously rotated about an axis perpendicular to the wafer. The wafer is then exposed to a chemical anisotropic etching agent to produce a uniform array of nozzles in the wafer wherein the lateral walls of the nozzles are substantially in the "111" plane of the wafer. The masking material is then stripped from the wafer.

11 Claims, 10 Drawing Figures

METHOD FOR PRODUCING NOZZLE ARRAYS FOR INK JET PRINTERS

BACKGROUND OF THE INVENTION

This invention relates to a method for simultaneously chemically etching an array of uniform through holes in a substrate and more particularly, the invention relates to the fabrication of nozzles for ink jet printers.

In prior art ink jet printing systems, it is known that an array of closely spaced nozzles is required. During ink jet printing with this system, drops are simultaneously ejected by all the nozzles and a charge electrode is arranged in front of each nozzle in the area where the drops are formed. A constant deflecting field is operable to deflect all the charged drops from the ink stream so that only the uncharged drops continue to the paper to form printed characters. An ink jet printer with an array of several nozzles is described in U.S. Pat. No. 3,373,437.

It has also been known in the prior art that a nozzle array suitable for use in ink jet printing can be fabricated by etching a semiconductor chip. One example of such an ink jet nozzle is described in U.S. Pat. No. 4,007,464 to Bassous et al, which patent is assigned to the assignee of the present invention. In this process one surface of the semiconductor chip is initially photoresist coated and then exposed and developed so that the etchant attacks only predetermined regions to produce the nozzles. Those nozzles have a pyramidally tapered cross-section.

Unfortunately, it is very difficult to produce substrates having a totally uniform thickness from semiconductor materials. Non-uniform thicknesses are particularly detrimental when several tapered nozzles are to be etched simultaneously. In this cse, a thin area of the substrate will have a larger orifice than in a thicker section, if both nozzles are etched simultaneously. Because of their improved characteristics, tapered such as conical or pyramidal nozzles such as described in the above-mentioned Bassous et al patent, are desirable for ink jet printers.

IBM technical disclosure bulletin Vol. 17 No. 11 April 1975 pages 3450-52 describes a method for simultaneously etching several nozzles in a silicon plate which produces uniform orifice widths irrespective of differences in the thickness of the silicon plate. Differences in the thickness of the plate are compensated for during the exposure of the photoresist layer by changing the size of the exposure area or, in the case of square exposure surfaces, by tilting them in relation to the direction of the silicon plate. These known methods of changing the surface attacked by the etchant necessitate that the photoresist free area associated with each nozzle be produced separately and that the thickness of the silicon plate be measured in those areas where a nozzle is to be etched. These factors make this method unsuitable for use in a production fabrication technique for ink jet nozzles.

Another method for compensating for the nonuniform thickness of the semiconductor substrate is described in application Ser. No. 781,616, filed Mar. 28, 1977, now U.S. Pat. No. 4,066,491, and assigned to the assignee of the present invention. The holes are first chemically pre-etched until the first hole is about to penetrate through the substrate and subsequently sputter etching is utilized until all holes have penetrated through the substrate. This method requires two separate etching steps which adds to the complexity of the method.

A further method for solving the problem of non-uniform semiconductor substrates in the production of ink jet nozzles is described in Application Ser. No. 805,675 filed on June 13, 1977, now abandoned, and assigned to the assignee of the present invention. In this application, the substrate is anisotropically etched from one side of the wafer until the openings are through in the thin section of the wafer. Apertures are then made in the masking material on the other side of the wafer in the locations where the nozzles are desired. The substrate is then anisotropically etched again so that the array of nozzles is then formed to the size of the apertures opened on the other side of the substrate. This method also requires two etching steps and for this reason has not proved entirely satisfactory in making nozzle arrays for ink jet printers.

SUMMARY OF THE INVENTION

It is therefore the principal object of this invention to provide an improved method which permits a plurality of tapered through holes to be simultaneously produced in a substrate by means of chemical etching whereby the holes have identical orifice widths irrespective of differences in the thickness of the substrate.

Briefly, according to the invention, the substrate is first coated with an etchant masking material on one surface. The wafer is then mounted in contact with a base member and a mask is mounted on a suitable support which positions the mask parallel to the base member spaced a predetermined distance from the base member. The wafer is then exposed through the mask by a suitable light source arranged at a predetermined angle relative to the wafer and, simultaneous with the exposure, the light source is rotated around an axis perpendicular to the wafer. The exposed wafer is then anisotropically etched to produce uniform orifices from the wafer including a wafer having non-uniform thickness.

DETAILED DESCRIPTION OF THE PREFERRED EMBODIMENTS

In principle my invention is applicable to the production of an ink jet nozzle array from substrates which have or can be made to have vastly different etching rates in one area compared to the etch rate in surrounding areas. Examples of substrates which have different etch rates comprise single crystal materials such as silicon and sapphire which have vastly different etching rates between an exposed and unexposed area when subjected o a suitable anisotropic etching solution. An example of a substrate material which can be made to have vastly different etching rates is a selectively crystallizable photosensitive glass which has a greater etching rate in an exposed and heat treated area compared to an unexposed area. My invention will be described in terms of its application to a specific embodiment in which the substrate is silicon, but it will be recognized that the invention is not so limited.

Figure 1:
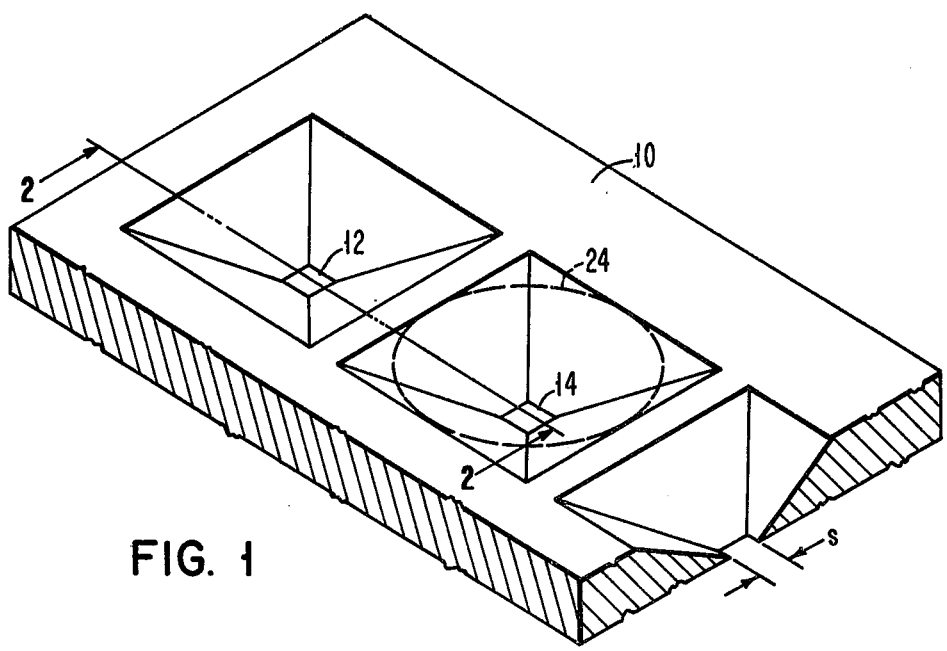
FIG. 1 is a perspective view of a silicon wafer which has been anisotropically etched to form a plurality of ink jet nozzles.
Figure 2:
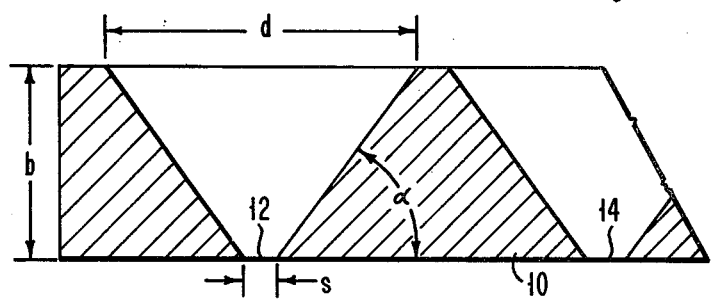
FIG. 2 is a cross-section view along lines 2—2 of FIG. 1.

A perspective view of a small portion of a nozzle plate of the type formed by a process according to the invention is shown in FIG. 1. A wafer 10 of silicon or like material is etched or otherwise processed subtractively to form openings 12 and 14. These openings serve in ink jet applications as nozzles where it is important that the orifices of all nozzles have the same critical dimensions within a close tolerance. A cross-section of a small portion of the nozzle plate of FIG. 1 is shown in FIG. 2. For example, the wafer may have a thickness b typically about 7 mils and the desired orifices dimension s is typically 800μ in. and the width of the nozzle d is typically 11 mils. To achieve uniform orifice dimensions in a nozzle array, it is necessary that the openings in the photoresist be uniform in size and the wafer thickness be uniform. The requirement for uniform openings in the photoresist can easily be met by using state of the art photolithographic semiconductor techniques. The requirement for uniform thickness in the wafer is a very difficult problem, since the tolerances required on the nozzle size dimension far exceed the current state of the art in wafer technology. Non-uniformity of the thickness results in non-uniformity of the other dimensions in subtractives material processing, but the process according to my invention is substantially insensitive to variations in thickness as will be seen from the description of my invention.

Figure 3:
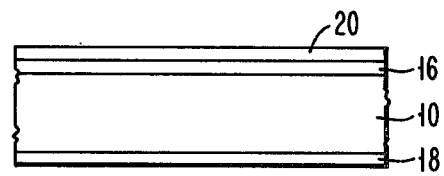
FIG. 3a–d represent sequential cross-section views of a silicon wafer processed to form the ink jet nozzles of FIG. 1.
Figure 3:
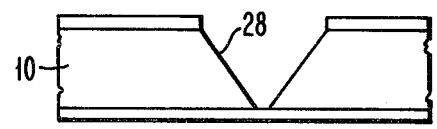
Figure 3:
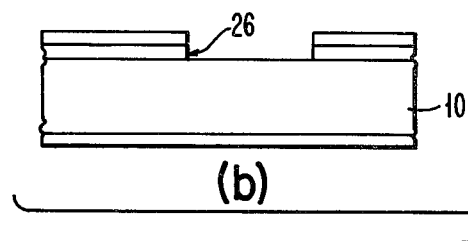
Figure 3:
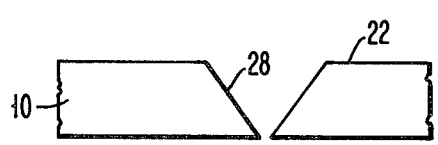
Figure 4:
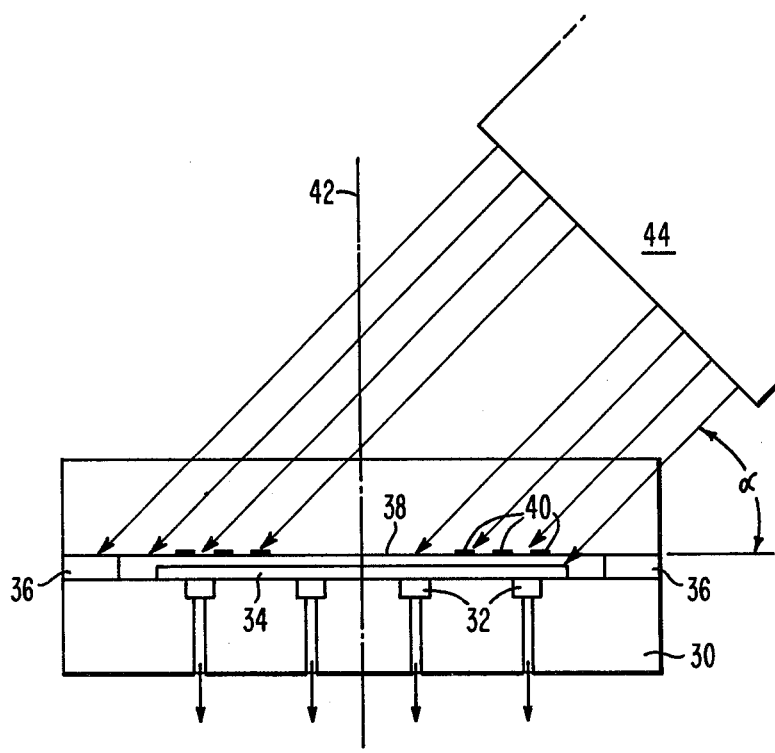
FIG. 4 is a diagrammatic schematic view showing apparatus for accomplishing the exposure step according to the invention.

The stages in the process, according to my invention, for forming an array of nozzles of uniform dimension are shown in FIG. 3. A layer of silicon dioxide 16, 18 is produced on both faces of the wafer by thermal oxidation as shown in FIG. 3a. A suitable photoresist layer 20 is applied on the face 22 (100 crystal plane for silicon) of the wafer that will eventually form the base of the pyramid shaped hole. The photoresist is then exposed through a suitable mask and this exposure is preferably done at an exposure station which is shown in FIG. 4. The photoresist is then developed to remove the non-exposed area and the silicon dioxide underlying the non-exposed area is etched to form an opening 26 as shown in FIG. 3b The remainder of the photoresist is then stripped from wafer 10 and the wafer is then subjected to an anisotropic etching solution to form an array of openings along the 111 crystal plane 28 in the wafer as shown (one opening only) in FIG. 3c. As can be seen with reference to the dashed circle 24 in FIG. 1, the photoresist left on the wafer after exposure and development has circular openings and the sides of the base of the pyramid shaped hole will be tangent to the circular opening after the anisotropic etching process. The silicon dioxide layers 16, 18 are then stripped from the wafer to form an array of ink jet nozzles.

The exposure station comprises a flat platen 30 containing vacuum ports 32 on which the photoresist coated wafer 34 is held in physical contact. The vacuum supplied to vacuum ports 12 is of such a level that it can pull a relatively thin wafer into physical contact over the entire surface. The platen 30 may conveniently be fabricated from an optical flat. In this case, it is possible to view the wafer through the optical flat so that it can readily be determined whether physical contact has been achieved. A suitable mask support member 36 is provided on the flat platen so that the mask substrate 38 can be supported parallel to the platen within a very small tolerance such as 10 microinches, and the spacing between the mask and the platen is greater than the maximum wafer thickness. The masking pattern consists of a plurality of opaque circular areas 40 deposited on the surface of the masking substrate 38 in the desired nozzle array pattern.

Figure 5:
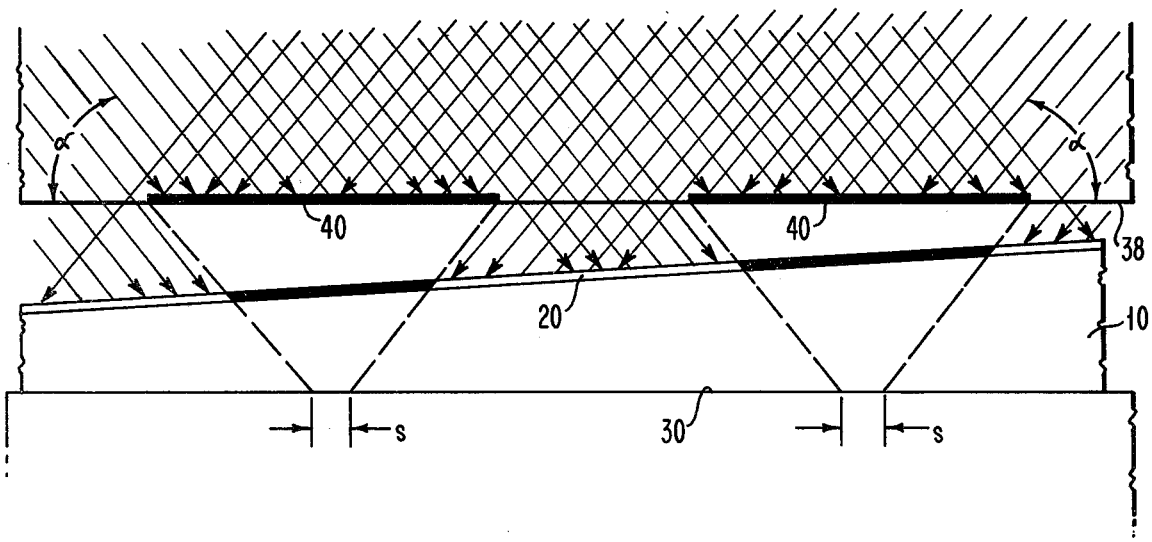
FIG. 5 is a diagrammatic schematic view showing the exposure step according to the invention as applied to a wafer of non-uniform thickness.

The diameter d of the opaque circular area 40 is determined as shown in FIG. 5.

$$d = s + 2b/\tan\alpha$$

where:
b = spacing between platen and mask;
d = diameter of opaque circular mask;
s = square orifice side dimension; and
α = angle between crystalographic planes 100 and 111 (approximately 54.7° for silicon).

Figure 7:
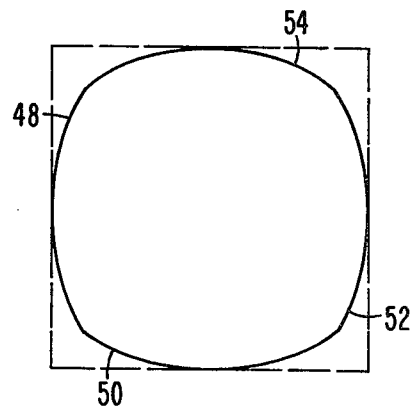
FIG. 7 is a diagram showing an enlarged view of the nonexposed area of the photoresist when exposed utilizing the apparatus shown in FIG. 6.

After the photoresist application and with the wafer 10 located on platen 30 as described above, the wafer is exposed by a suitable light source 44. Light source 44 may comprise any suitable source which produces radiation at a wavelength to which the photoresist is sensitive. Mercury and Xenon light sources are suitable for many of the photoresist materials. These sources may be accompanied by suitable filters if necessary and a lens system to collimate the light if necessary. Light source 44 is a columnar beam covering the full wafer area and directed onto the wafer at an angle α which is approximately 53.7° for silicon. The columnar light beam is rotatable around an axis 42 perpendicular to the wafer 10. Alternatively the relative motion can be produced by keeping light source 44 fixed and rotating the wafer about axis 42. The relative motion can be by continuous rotation in which case the unexposed area for an orifice is circular (as shown by dashed circle 24 in FIG. 1). Alternatively the relative motion can be by a plurality of increments, for example, four increments each comprising 90 degrees movement. In this case, the unexposed area comprises four elliptical curved sections as shown in FIG. 7.

FIG. 5 shows an enlarged section of a wafer array, and it can be seen that after a full 360° rotation of the columnar beam, the non-exposed areas on the photoresist will be a circular area and that the diameter is exactly equal to that which will produce the desired orifice size after the anisotropic etching, and this is independent of the wafer thickness.

Figure 6:
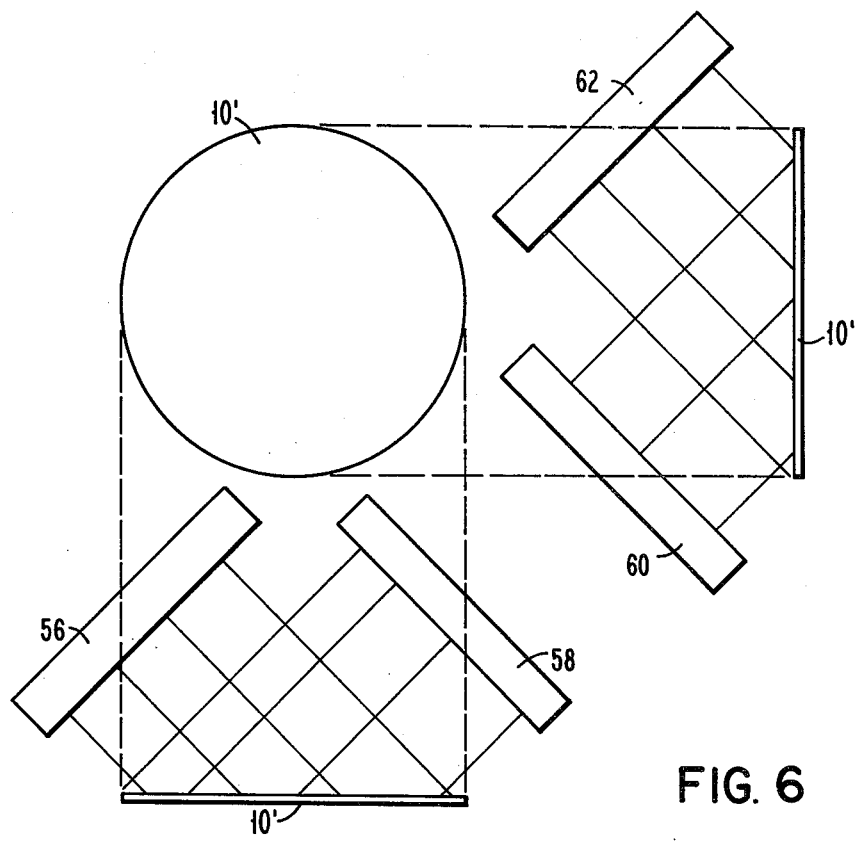
FIG. 6 is a diagrammatic schematic view showing alternate apparatus for accomplishing the exposure step according to the invention.

After exposure of the photoresist, the non-exposed area is removed by a suitable solvent that will dissolve the non-exposed portion of the photoresist, and the wafer is then processed through the chemical etching process. The chemical etching process can be carried out according to the process described and claimed in the above-mentioned U.S. Pat. No. 4,007,464 to Bassous et al. This etching is carried out by exposing the silicon wafer to a solution containing ethylene diamine, pyrocatechol and water at 110°–120° C. to form the tapered openings in the wafer. Etching is stopped when orifices appear on the lower side of the wafer. The etching period is generally on the order of three to four hours for a substrate on the order of 7 mils thick. The oxide layer is then stripped from both sides of the wafer. An alternate embodiment of the exposure step is shown in FIG. 6. In this embodiment, four separate light beams 56, 58, 60 and 62 are used to expose the wafer 10' simultaneously. In this case, it is not necessary to rotate the light source. As shown in FIG. 7, the exposed area is not circular, but an area comprising four elliptical curved sections 48, 50, 52 and 54. This shape, however, produces the same orifice size and shape as the circular area produced in the previously described embodiment when used with anisotropic etching of a single crystal material.

While the invention has been particularly shown and described with reference to preferred embodiments thereof, it will be understood by those skilled in the art that various changes in the form and details may be made therein without departing from the spirit and scope of the invention.

What is claimed is:

1. The method for producing nozzle arrays for ink jet printers comprising the steps of:
    mounting a radiation sensitive wafer in physical contact with a base member; said wafer comprising a crystalline material having greatly different anisotropic etch rates in different crystallographic directions;
    positioning a mask structure having a predetermined pattern of orifice masks thereon parallel to the base member;
    exposing the wafer through the mask by a columnar light source directed at a predetermined acute angle to said wafer and simultaneously producing relative rotational motion between said light source and said wafer around an axis perpendicular to the base member;
    treating the wafer to render it subject to anisotropic etching only in the non-exposed areas of the wafer; and
    anisotropically etching the wafer to produce uniform orifices corresponding to said predetermined pattern from said wafer.

2. The method of claim 1 wherein the step of producing relative motion between said light source and said wafer comprises rotating the light source around an axis perpendicular to the base member.

3. The method of claim 1 wherein the step of producing relative motion between said light source and said wafer comprises producing said motion in a plurality of equally spaced steps.

4. The method of claim 1 wherein the step of producing relative motion between said light source and said wafer comprises indexing said base member to a plurality of equally spaced positions.

5. The method of claim 1 wherein said wafer comprises a monocrystalline silicon wafer and said predetermined angle is about 54.7 degrees.

6. The method for producing nozzle arrays for ink jet printers comprising the steps of:
    mounting a resist coated silicon wafer in physical contact with a base member;
    positioning a mask support structure having a predetermined pattern of orifice masks thereon parallel to the base member;
    exposing the wafer through the mask by a suitable columnar light source directed at an angle of about 54.7 degrees to the wafer and simultaneously producing relative rotational motion between the light source and the wafer around an axis perpendicular to the base member;
    treating the wafer to remove the resist in the non-exposed area of the wafer; and
    anisotropically etching the wafer to produce uniform orifices from said wafer.

7. The method of claim 6 wherein the step of producing relative motion between said light source and said wafer comprises rotating the light source around an axis perpendicular to the base member.

8. The method of claim 6 wherein the step of producing relative motion between said light source and said wafer comprises producing said motion in a plurality of equally spaced steps.

9. The method of claim 6 wherein the step of producing relative motion between said light source and said wafer comprises indexing said base member to a plurality of equally spaced positions.

10. The method for producing nozzle arrays for ink jet printers comprising the steps of:
    mounting a radiation sensitive wafer in physical contact with a base member; said wafer comprising a crystalline material having greatly different anisotropic etch rates in different crystallographic directions;
    positioning a mask structure having a predetermined pattern of orifice masks thereon parallel to the base member;
    exposing the wafer through the mask by a plurality of columnar light sources spaced around said wafer, each of said light sources being directed at a predetermined acute angle to the wafer;
    treating the wafer to render it subject to anisotropic etching only in the non-exposed areas of the wafer; and
    anisotropically etching the wafer to produce uniform orifices corresponding to said predetermined pattern from said wafer.

11. The method according to claim 10 wherein said wafer comprises a monocrystalline silicon wafer and said predetermined angle is about 54.7 degrees.

* * * * *